(12) United States Patent
Uhl et al.

(10) Patent No.: US 6,919,535 B2
(45) Date of Patent: Jul. 19, 2005

(54) ELECTRIC HEATING FOR MOTOR VEHICLES

(75) Inventors: Günter Uhl, Helmstadt-Bargen (DE); Michael Niederer, Kappellen-Drusweiler (DE); Marc Bernhardt, Achenheim (FR); Franz Bohlender, Kandel (DE)

(73) Assignee: Catem GmbH & Co. KG, Herxheim bei Landau/Pfalz (DE)

( * ) Notice: Subject to any disclaimer, the term of this patent is extended or adjusted under 35 U.S.C. 154(b) by 0 days.

(21) Appl. No.: 10/647,648

(22) Filed: Aug. 25, 2003

(65) Prior Publication Data

US 2004/0084431 A1 May 6, 2004

(30) Foreign Application Priority Data

Sep. 2, 2002 (EP) .............................................. 02019707

(51) Int. Cl.$^7$ ................................................. H05B 3/06
(52) U.S. Cl. ........................ 219/202; 219/209; 165/80.3
(58) Field of Search ................................ 219/202, 209, 219/530, 540; 165/80.3; 237/12.3 R; 65/80.3

(56) References Cited

U.S. PATENT DOCUMENTS

| | | | | |
|---|---|---|---|---|
| 5,461,766 A | * | 10/1995 | Burward-Hoy | 29/447 |
| 5,596,231 A | * | 1/1997 | Combs | 257/776 |
| 6,046,498 A | * | 4/2000 | Yoshikawa | 257/706 |
| 6,545,351 B1 | * | 4/2003 | Jamieson et al. | 257/712 |
| 6,700,780 B2 | * | 3/2004 | Hedberg et al. | 219/209 |
| 2001/0013512 A1 | * | 8/2001 | Eisenhardt et al. | 219/202 |
| 2001/0050843 A1 | | 12/2001 | Ueno et al. | |
| 2002/0011484 A1 | | 1/2002 | Beetz et al. | |

FOREIGN PATENT DOCUMENTS

| | | |
|---|---|---|
| DE | 199 49 429 A | 5/2001 |
| EP | 0 901 311 | 3/1999 |
| EP | 0 907 307 A | 4/1999 |
| FR | 2 639 764 A | 6/1990 |
| FR | 2 777 734 A | 10/1999 |
| GB | 2 345 576 | 7/2000 |
| JP | 60 100457 | 10/1985 |

OTHER PUBLICATIONS

IBM Technical Disclosure Bulletin, vol. 21, issue No. 8, pp. 3378–3380, "Silicon Heat Sink Method to Control Chip Operting Temperatures", Jan. 1979.*

* cited by examiner

Primary Examiner—Teresa J. Walberg
(74) Attorney, Agent, or Firm—Boyle Fredrickson Newholm Stein & Gratz S.C.

(57) ABSTRACT

An electric heating device as supplemental heating for motor vehicles includes as the heating elements power transistors directly mounted on the printed circuit board. For efficient removal of the dissipation heat from the power transistors the latter are in direct contact on their underside with a cooling element via openings in the printed circuit board. In order to simplify manufacture, the cooling elements are formed in two pieces: the heat conducting disk with a small thermal mass insertable into the opening of the printed circuit board, and the cooling body which can be connected to that heat-conducting element.

29 Claims, 8 Drawing Sheets

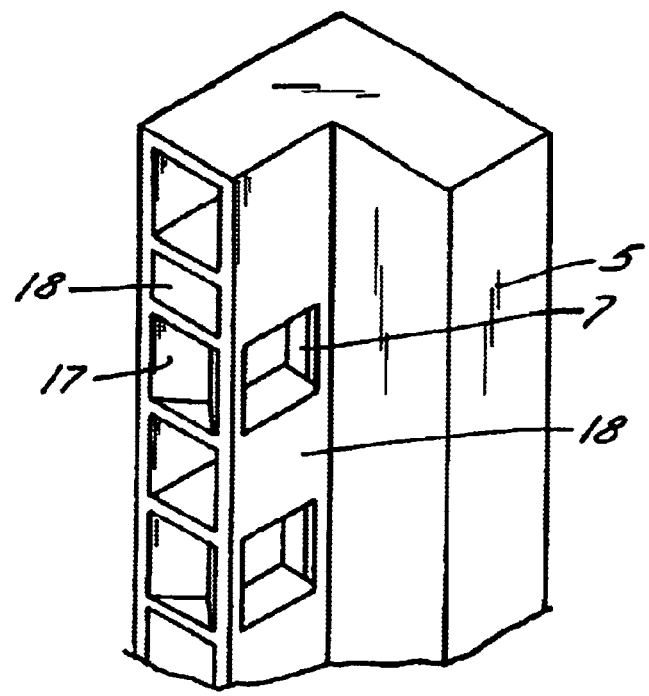
FIG. 5a
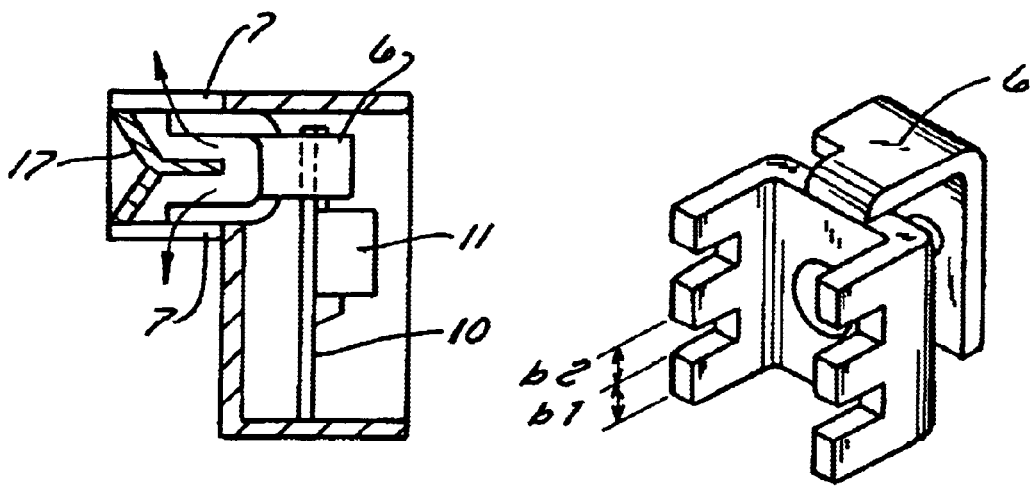
FIG. 5b
FIG. 5c

ELECTRIC HEATING FOR MOTOR VEHICLES

BACKGROUND OF THE INVENTION

1. Field of the Invention

The invention relates to an electric heating device for heating air, which in particular is suitable for use as supplemental electric heating in motor vehicles.

2. Description of the Related

For use in motor vehicles, particularly in such having motors optimised for the least possible consumption, electric heating devices are used for heating the interior and/or the motor. Supplemental electric heating is in particular needed after starting the motor as long as the combustion engine does not provide sufficient thermal energy. Combustion engines optimised for the least possible consumption basically even require the use of supplemental electric heating.

The use of such heating devices is, however, not limited to the field of motor vehicles; they are also suitable for a number of other uses, for instance in the field of home installations (room air conditioning), industrial plants, etc.

From EP-A2-0 902 311 an electric heating device for motor vehicles is known. The heating device described comprises several heating elements joined together in a heater block. The heater block, together with a control unit for controlling the heating elements, is held in a common frame. The control unit thus constitutes a structural unit with the heater block held in the frame. The control unit comprises a power electronics system with electronic switches each of which is provided with a cooling body. The control unit is arranged such that a portion of the air current to be heated is blown onto the control unit, in particular the cooling elements, for cooling the electronic switches.

The electronic switches, in particular in the form of power transistors, which control the power fed to the heating elements, are directly mounted on a printed circuit board on one side. To remove the dissipation heat generated by the power transistors a cooling element or cooling plate is provided on the opposite side of the printed circuit board. In order to improve the heat transfer between the transistor and the cooling element through the printed circuit board, the printed circuit board is provided in the area between the transistor and the cooling element with a number of feed-throughs. A disadvantage with this well known approach is that the heat conductivity of these feed-throughs does not suffice to remove the dissipation heat. Although these feed-throughs are provided for in a region of about 1 cm$^2$ below the power transistor, the dissipation heat cannot be conducted by them to the cooling elements in a magnitude of over/more than 6 watts.

From EP-A-1 157 867 an electric heating device is known where the damper register and the electric control unit are likewise integrated into one structural unit. The power transistors of the control unit are arranged directly on the printed circuit board, and on their underside they are contacted by a cooling element via a bore in the printed circuit board. Such a cooling element, which is in direct contact with the power transistor, can remove the dissipation heat of the power transistor in a simple manner and in an adequate amount.

A disadvantage with this heating device is however the clamp fastening of the cooling element to the transistor. Vehicle vibrations can have a negative effect on the fastener of the cooling element so that effective heat transfer is reduced. In addition, the clamp is unable to compensate for unevenness in the contact surface of the transistor and the surface of the peg element protruding through the printed circuit board. In this way, heat transfer is impaired and cannot be calculated and the contact surface is unable to remove the dissipation heat from the power transistor equally over the entire transistor surface.

Alternatively, the transistor and the cooling element can be soldered together at the contact surface. With this fastening the clamp can be dispensed with and at the same time a reliably high heat transfer reading can be ensured at the contact surface of the transistor and the surface of the peg of the cooling element protruding through the printed circuit board. A disadvantage with this fastening is its costly production. The power transistors, due to their much smaller mass by comparison with the cooling bodies, are subject to a particular high thermal load with such a manufacturing process. The considerable mass of the cooling body requires maintaining the control circuit during the soldering process for a much longer period of time than usual at the soldering temperature in order to heat the entire cooling body to the corresponding temperature as well. In the soldering process the control circuit with the power transistors and the cooling bodies is subjected to a temperature of about 230° C. Due to its small mass, the power transistor very quickly absorbs the ambient temperature. The period of time until the cooling body is heated to a corresponding level however generally exceeds the maximum allowable time for which the power transistors may be exposed to such a temperature.

SUMMARY OF THE INVENTION

The invention therefore provides a heating device with adequate removal of the dissipation heat and which can be manufactured in a simple manner.

This is achieved with the features of patent claim 1.

According to the invention, the cooling element is formed in two parts, more specifically one consisting in a heat-conducting element and one consisting in a cooling body which can be connected to the heat-conducting element. Due to the two-part construction of the cooling element, the parameters of both parts are separately adjustable. In particular the size, the thermal mass, the shape and the material of the two parts are individually selectable so that with the proper choice of parameters the manufacturing costs can be significantly reduced.

Due to the division into two parts, both parts of the cooling element can be connected to the control circuit at different points in time of the manufacturing process. In doing so, the amount of heat which can altogether be removed via the cooling element in comparison with a one-piece embodiment is essentially unchanged. According to the invention, the thermal mass of the cooling element can be split into a very small component, the heat-conducting element, and a large component, the cooling body. The small thermal mass is connected to each of the transistors during the manufacturing process. Recourse to particularly heat-resistant transistors, as is traditionally required, can thus be avoided. The second component with the large thermal mass can subsequently be connected to the first component without any danger. Thus a heating device can be manufactured in a significantly simpler and less expensive way.

According to an advantageous embodiment of the invention the two components of the cooling element are glued to each other. In this way, a particularly effective and highly heat-conductive connection can be produced in a simple way.

The glue used to glue the two components to each other preferably produces, besides a mechanically tight and highly heat-conductive connection, electric insulation of the two parts of the cooling element, i.e. the heat-conducting element and the cooling body. In this way, electric insulation of the cooling body from the heat-conducting element can be simultaneously achieved so that the underside of the transistor, usually also plus poled, is not in contact with the parts of the heating device accessible from the outside.

A further advantage of this invention lies in the fact that different materials can be chosen for the two components of the cooling element. Thus, for example, for the cooling body a less expensive material can be chosen than for the heat-conducting element since only then can dissipation heat be removed in a sufficient amount if the latter can be conducted to the cooling body via the heat-conducting element. In this way, the cooling element altogether can be manufactured particularly inexpensively without reducing the amount of heat that can be removed.

In a preferred embodiment the heat-conducting element is made of copper. Copper, which exhibits good heat conductivity but is relatively expensive, must therefore only be used at the point particularly critical for heat conduction, i.e. for heat conduction from the transistor through the board to the cooling body. Such a heat-conducting element made of copper can be manufactured particularly inexpensively for example as a pressed piece or a sintered piece.

According to another preferred embodiment the cooling body is made of aluminium. Due to the large cooling body mass the choice of a less expensive material has a particularly advantageous effect on total manufacturing costs. In addition, the cooling body itself can thus be produced inexpensively as a punched and bent piece.

It is therefore a special advantage of the present invention that the two-part embodiment of the cooling element allows for particularly simple manufacture of each of the components so that the manufacturing costs are considerably reduced when compared with a one-piece embodiment.

According to an advantageous embodiment the opening provided for in the printed circuit board and the heat-conducting element are basically formed cylindrically. Such a shape makes particularly inexpensive manufacture possible.

According to a preferred embodiment, the cooling body has an essentially flat section which is in contact with the printed circuit board. This section is provided with an opening through which one end of the heat-conducting element protrudes. The heat-conducting element exhibits on one end protruding through the flat section of the cooling body at least one lateral projection through which the cooling body is mechanically fastened. With such an arrangement gluing the cooling body to the heat-conducting element can be dispensed with.

Preferably the lateral projection for fastening the cooling body is formed as a bulb fitting around the end of the heat-conducting element. With such a bulb particularly good mechanical fastening of the cooling body can be achieved in a simple manner.

In an advantageous embodiment of the invention the air to be heated is not blown onto the control unit as a whole, but the air throughput used to cool the power electronics system can be controlled through window openings. Preferably the window openings are arranged such as to allow only the cooling ribs of the cooling bodies to be blown on by outside air. In this way the amount of air used to cool the power electronics system is adjustable such that no zones of varying temperature occur in the heated air current, i.e. the current of cooling air and the air current heated up by the radiator elements have approximately the same initial temperature. In this way the effectiveness of the entire heating device is not reduced by the air current diverted for cooling the electronic control system.

In an advantageous embodiment of the invention, within the region between the window openings on opposing sides, means of influencing the air current are provided for. In this way the air current can be directed such that it directly blows onto the cooling elements of the power electronics system in order to achieve maximum heating up of the cooling airflow. A particularly advantageous variant can be achieved with U-shaped cooling elements where additional air-conducting elements protruding between the legs of the U-shaped cooling elements can be provided.

An even better removal of dissipation heat can be achieved if the cooling air is also directed over the components of the control unit. For this, the board of the control unit is preferably only provided with components on one side. In this way, a particularly simple flow onto the components can be reached. In addition, such an arrangement of the components is also particularly advantageous for technical manufacturing reasons.

In an advantageous embodiment of the invention the board is arranged vertically to the plane of the frame of the heater block. Due to such an arrangement, on the one hand, simple blowing of air onto the components is possible and, on the other hand, in this way a small structural depth of the electric heating device can be achieved.

In order to eliminate the danger emanating from a cooling body in contact with electric current with its surfaces accessible from the outside, the surface of the cooling body is provided with an electrically insulating coating on the outside. With such a measure, in a simple manner an electric short circuit such as that caused by metal parts falling into the heated/to be heated air current can be prevented.

Preferably the cooling body is only provided with an electrically insulating coating in those areas that are accessible from the outside, i.e. particularly the cooling ribs lying opposite the window openings.

For the gluing of both components of the cooling element different glues can be used advantageously. An epoxy resin glue facilitates particularly tight joining of the two components, in particular when the cooling element is additionally glued to the printed circuit board. A silicon glue can compensate for varying expansion coefficients of the glued materials. Another advantageously usable glue is an acrylic glue. The advantage of these glues lies particularly in the fact that no plane-parallel surfaces of the individual parts, i.e. the heat-conducting element, the cooling body and the printed circuit board are required since any unevenness is evened out by the glues.

According to a preferred embodiment, the heat-conducting element is formed such that its cross-section area increases from the transistor to the cooling body. With such a design, the greatest possible effect can be achieved with minimum use of material. Such an embodiment of the heat-conducting element takes into account the fact that the dissipation heat generated by the power transistor is disseminated in the form of a heat-conducting cone, whereby the heat-conducting cone with its flattened-off point starts from the semiconductor element of the transistor.

With a particularly simple embodiment of the heat-conducting element the latter is essentially cylindrically formed and preferably in a section arranged in the opening of the printed circuit board with a smaller diameter than in a section protruding from the printed circuit board.

According to another advantageous embodiment of the heat-conducting element the section arranged in the opening of the printed circuit board is conically formed. Such a shape makes it possible to save material and to insert the heat-conducting element into the printed circuit board in a simple manner.

For better mechanical fastening the heat-conducting element is provided with radial projections preferably aligned vertically. Such an embodiment allows for easy insertion and simultaneous mechanical fastening of the heat-conducting element. For this the diameter of the points of the radial projections is slightly larger than the inside diameter of the opening in the printed circuit board. In this way the heat-conducting-element is mechanically fastened in the printed circuit board immediately after being inserted.

The cooling body can be manufactured particularly inexpensively if it has an essentially rectangular cross-section. A first section of the cooling body is for this purpose arranged preferably in parallel to the printed circuit board and a second section protrudes vertically away from the first section.

For better mechanical fastening of the cooling body the latter is provided with recesses on the end protruding from the printed circuit board serving to accommodate the heat-conducting element. In this way the cooling body can simultaneously be fastened mechanically on the printed circuit board, for instance by gluing, in order to be able to absorb greater mechanical stress than if it were solely glued to the heat-conducting element.

In a particularly advantageous embodiment provision is made for a joint cooling body for several power transistors with a corresponding number of heat-conducting elements. Such a cooling body can be manufactured in a particularly simple and inexpensive manner. In addition, the loss power of individual power transistors can be removed more easily, in particular if the power transistors generate unequal loss power.

Additional advantageous embodiments of the invention are indicated in the sub-claims.

BRIEF DESCRIPTION OF THE DRAWINGS

Here below the invention is described on the basis of the enclosed drawings, in which:

FIGS. 5a, 5b and 5c show detailed views of additional embodiments for cooling the power transistors;

DETAILED DESCRIPTION OF THE PREFERRED EMBODIMENTS

Figure 1A:
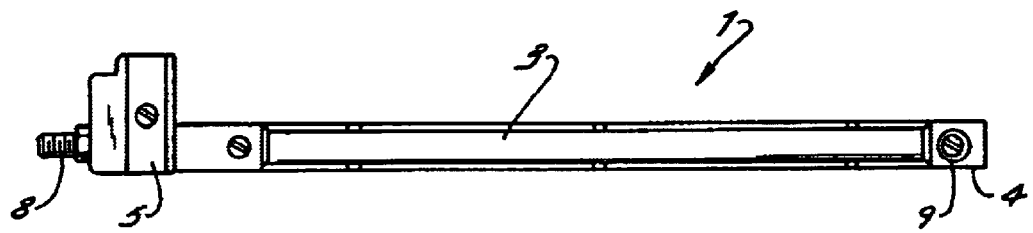
FIGS. 1a and 1b show a top view and side view of an electric heating device according to the invention.
Figure 1B:
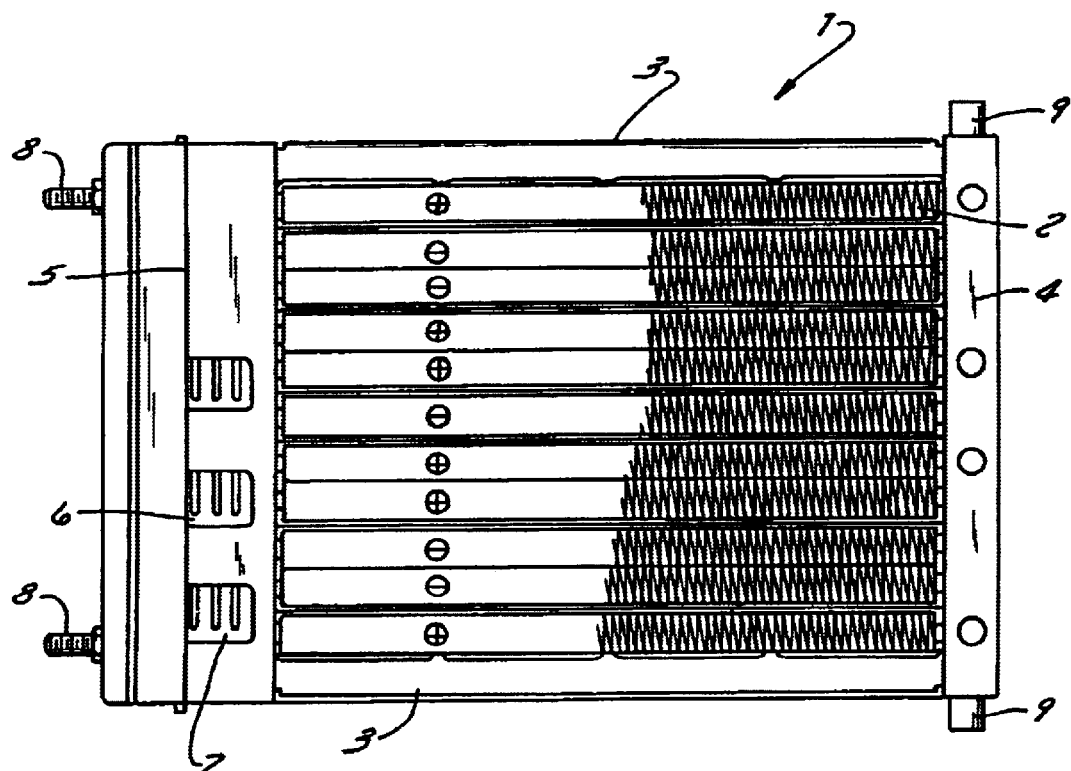

In FIG. 1a a side view of the electric heating device 1 according to the invention is shown. FIG. 1b shows a top view of the electric heating device 1. The electric heating device 1 contains a heater block consisting of heating elements 2 the majority of which is layered or stacked. Each heating element 2 consists of a resistance heating element and, arranged next to it, radiators or heat-conducting sheets. PTC elements are preferably used as resistance heating elements. The heater block consisting of the heating elements 2 is held in a frame. This frame consists of opposing longitudinal members 3 and, arranged vertically thereto, the lateral members 4 and 5. The members of the frame are made of either metal or plastic.

Whereas the longitudinal members 3 are essentially symmetric in their structure, the two lateral members 4 and 5 in the embodiment shown in FIG. 1 are different from each other.

In contrast to the lateral member 4, the lateral member 5 is formed as a box open on one side. The opening of this box-shaped lateral member 5 is located on the side of the lateral member 5 opposite the heating elements 2. A control unit can be inserted into this box, which controls the heat emission of the individual heating elements 2 by controlling the current fed to the heating elements 2. The open side of the lateral member 5 formed as a box is, after inserting the control circuit, closed with an attachable or clip-on cover.

The printed circuit board 10 of the control unit is, after insertion, preferably arranged vertically to the plane of the frame, but parallel arrangement is also possible (not shown).

Power supply of the heating device 1 is provided via two connector bolts 8. They are formed such that they can easily conduct the heating currents required. The connector bolts 8 protrude in the embodiment shown in FIG. 1 from the side on which the box-shaped lateral member 5 is open.

On the same side a further plug base is provided for controlling the control unit and which is not shown in FIG. 1.

The lateral member 5 exhibits on the sides located in the surface plane of the frame the window openings 7. These window openings 7 are arranged such that they likewise lie in the air current to be heated. Between the window openings 7 lying opposite each other cooling elements 6 are arranged that are allocated to the power electronics components of the control circuit. When in operation, not only the heater block formed by the heating elements 2 but also the window openings are permeated with air to be heated up.

The choice of the size of the window openings 7 allows for determining the portion of the amount of air flowing past the cooling elements 6. According to the invention, the air throughput is adjusted such that the air flown through the heater block and the air flown past the cooling elements 6 exhibit as little temperature difference as possible. Only if the air flown through the window openings 7 approximates with its temperature the air flown through the heater block as far as possible is a maximum efficiency achieved in the operation of the heating device.

Figure 2:
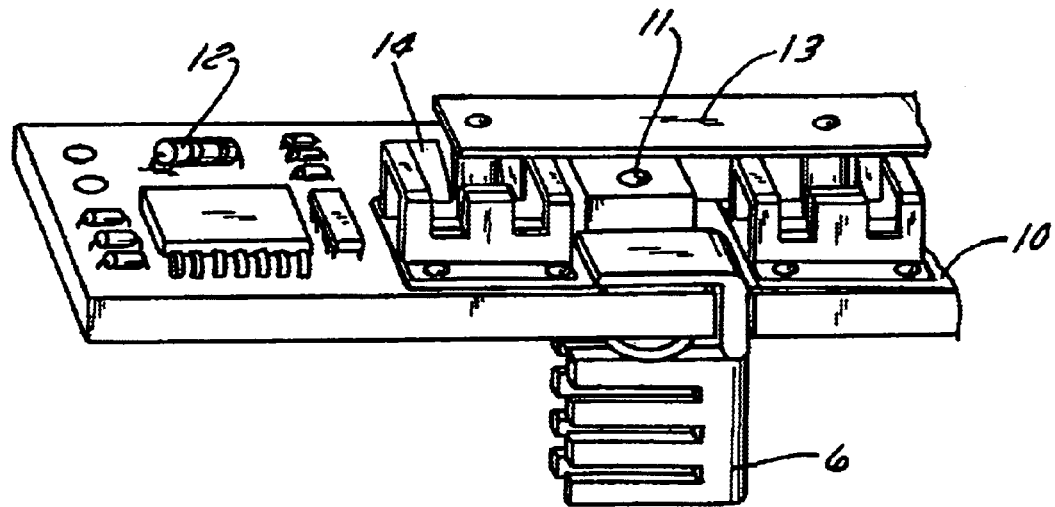
FIG. 2 shows a detailed view of the printed circuit board of the control unit provided with components.

FIG. 2 shows a detailed view of the control unit arranged inside the box-shaped lateral member. On a printed circuit board 10, alongside the power electronics components 11, an electronic control system 12 is provided. The electronic control system 12 determines the amount of electricity to be supplied by the power electronics components 11, in particular the power transistors, to the heating element 2 allocated to each of these. The amount of electricity is fed to the control circuit from one of the connector bolts 8 via a line bar 13. The output of the power transistor 11 is firmly soldered to the printed circuit board 10 and connected to a spring element 14 allocated to that transistor for forwarding the current to the respective heating element.

The spring elements 14 are attached to the printed circuit board such that, when the control unit and the heater block are plugged together, they are connected to the heating element connection lugs protruding into the lateral members 5. Such connection lugs 15 can be recognised in FIGS. 3 and 4.

In the embodiment shown the connection lugs 15 are plugged into the spring elements 14 through the printed circuit board 10. Such an arrangement allows for a tight mechanical fastening of the printed circuit board 10 with the electronic control system in the frame. At the same time, an electric contact is effected with the respective heating elements.

The printed circuit board is provided with components only on one side. According to the number of heating levels the printed circuit board exhibits power transistors 11 fastened horizontally to the same. In the embodiment shown, three heating levels and accordingly three power transistors are provided for. Each power transistor 11 is at its output terminal firmly soldered to the printed circuit board 10.

Figure 6:
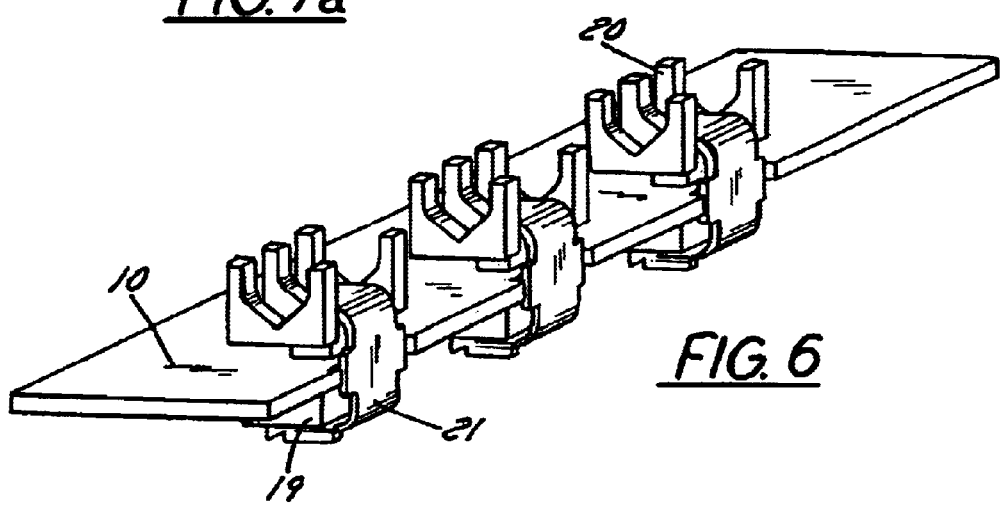
FIG. 6 shows a simplified detailed perspective view of another embodiment of the control unit according to the present invention.

Each of the power transistors is connected to a cooling element for removal of the dissipation heat. As shown in FIGS. 2 and 6, the cooling element 6 has cooling ribs arranged vertically to the printed circuit board on one plane. The cooling ribs are preferably arranged on the side of the printed circuit board left bare. To remove heat from the transistor to the cooling element the cooling element makes contact directly with the transistor. Such contact occurs according to the invention via an opening arranged below the transistor.

A corresponding arrangement of the components of transistor 11, spring element 14 and cooling element 6 is provided on the printed circuit board for each heating level.

Figure 3:
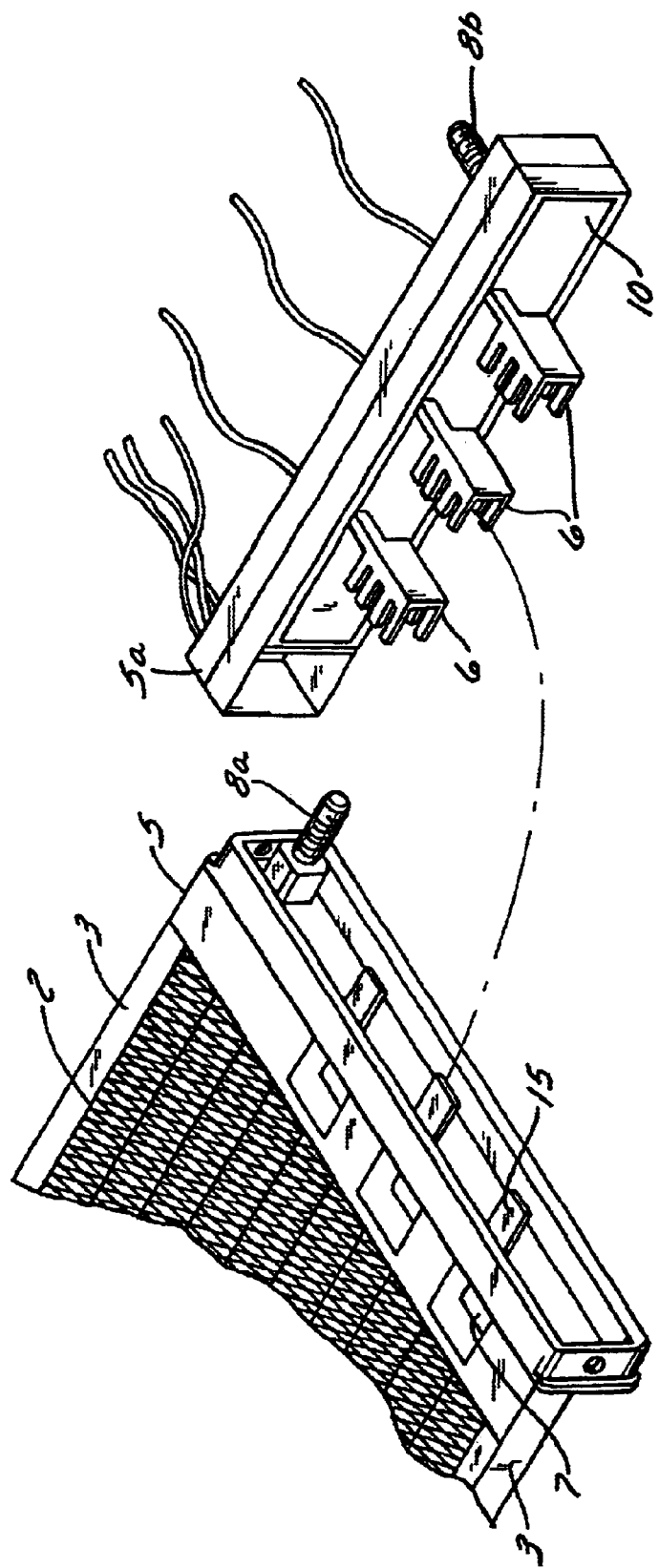
FIG. 3 shows a detailed view of the box-shaped lateral member and the control unit insertable into the same.

FIG. 3 shows a detailed view of the box-shaped lateral member 5 and of the control circuit insertable into the same. The lateral member 5 is connected on one side to the longitudinal members 3 and the heater block with the heating elements 2. On the surface of the lateral member 5 the window-shaped openings 7 can be recognised through which the air to be heated passes.

Inside the box-shaped lateral member 5 three connection lugs 15 and one connector bolt 8a can be recognised. This connector bolt constitutes the plus connection for all heating elements 2. Additionally, in this illustration in perspective view the control unit 5a can be recognised which can be inserted into the box of the lateral member 5. The control unit 5a is inserted into the lateral member 5 with the side pointing towards the lateral member 5.

On the side of the control unit 5a pointing towards the lateral member 5 the underside of the printed circuit board 10 can be recognised. Three cooling elements 6 protrude from the printed circuit board 10. Each of these cooling elements or cooling sheets is allocated to one of the power transistors 11 of a heating level.

For each cooling element 6 corresponding window openings 7 are provided in the surface of the lateral member 5. Therefore, during operation, an air current is specifically fed to each cooling element.

On the side pointing to the outside an additional connector bolt 8b can be recognised. This connector bolt serves as an electric ground pole when power is supplied. The connector bolt 8b is connected to the line bar 13 shown in FIGS. 2 and 4 that feeds the heating current to the various heating levels. Every one of the heating levels drains via its power transistor 11 up to about 40 amperes of the amount of electricity supplied via the conductor sheet 13.

Figure 4:
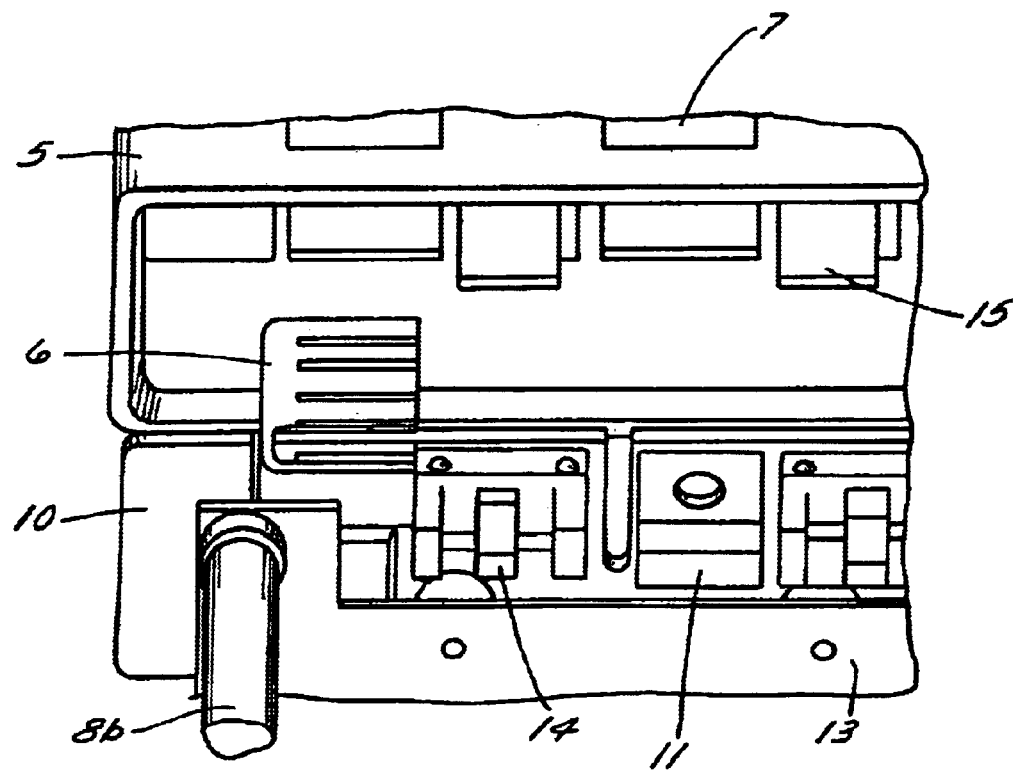
FIG. 4 shows a further detailed view of the box-shaped lateral member and the control unit insertable into the same.

In FIG. 4 a further detailed perspective view of the lateral member 5 and of the control circuit insertable into the box-shaped opening of the lateral member 5 are shown.

In the upper part of FIG. 4 on the surface of the lateral member 5 two of the window openings 7 can be recognised. These window openings are arranged such that they lie above and below the cooling elements 6 if the control circuit is inserted into the lateral member 5.

Inside the box-shaped opening of the lateral member 5 the connection lugs 15 of the heating elements 2 can be recognised. One connection lug 15 is provided for each heating level.

In the lower half of FIG. 4 the control circuit insertable into the lateral member 5 is shown. Only one of the power transistors 11 is provided with a cooling element 6 in this case, in order to provide a better view of the structure. Otherwise the structure of the control circuit corresponds to the control circuit described in connection with FIG. 2.

FIG. 5 shows a further embodiment in order to effectively remove the dissipation heat from the transistors. Here in FIGS. 5a, 5b and 5c various detailed views are shown, more specifically such views in which this embodiment particularly differs from that described before.

In FIG. 5a a slightly modified embodiment of the lateral member 5 can be recognised. Here the arrangement of the window openings 7 corresponds to the embodiment described before. In order to influence the air current more specifically, between the window openings 7 in the lateral member 5 walls are provided to the extent this is possible without obstructing the insertion of the control circuit into the lateral members 5, whereby all spaces in between located on the upper side between the windows and on the side pointing towards the heating element are closed off with additional walls 18. In this way, any unspecific flowing around of air is avoided during operation.

In FIGS. 5a and 5b the conduct of air between the window openings 7 is shown in detail. For the specific conduct of air an air guide element 17 is inserted into the sections lying between the window openings 7. As can be seen in FIG. 5b, a Y-shaped spoiler element allows for better flowing around the cooling ribs of an L-shaped or U-shaped cooling element 6. Here the cooling ribs of the cooling element 6 are arranged in each case next to the window openings 7.

In FIG. 5b, in addition, the printed circuit board 10 is indicated with the power transistor 11.

FIG. 5c shows a corresponding embodiment of the cooling element 6. Whereas in the embodiment described before an essentially U-shaped cooling element 6 with its U-shaped side stands vertically on the board, in this embodiment the cooling element 6 is arranged such that the U-shape is arranged with its underside parallel to the printed circuit board 10. Accordingly, the Y-shaped air guide element 17 is arranged such that it protrudes from the side of the lateral member 5 pointing towards the heating elements in the direction towards the control unit. By using a cooling element 6 in accordance with the first embodiment, corresponding air guide elements can be arranged at the lateral delimitations between the window openings 7 lying opposite each other.

In the embodiment shown in FIG. 5c the width b1 of a cooling rib is about 3 mm whereas the distance b2 between the cooling ribs is somewhat less, i.e. approximately 2.5 mm. The cooling element is preferably made of aluminium or copper.

In FIGS. 6 and 7 a further embodiment of a control unit according to the invention is illustrated. In this embodiment in particular alternative arrangements of the power transistors and cooling elements are shown. The cooling elements 20 are connected in this embodiment in a different way to the power transistors. In the embodiments above cooling lugs protruding on one side from the power transistor are formed on the power transistors 11. The cooling elements in the embodiments described above are attached to these cooling lugs. The cooling lugs of the power transistors are soldered to the printed circuit board. In the embodiment described below the cooling elements are connected through the printed circuit board 10 via an opening directly to the underside of the transistor 19. Mechanical fastening of the cooling element can in this case for instance occur by gluing or by means of a clamp fastener as shown in FIG. 7.

The cooling element 20, as shown in FIGS. 6 and 7, is formed for a clamp fastener. In order to allow for the gripping of a clamp 21, the cooling element 20 exhibits an asymmetric design of the cooling ribs. For this on one side of the preferably U-shaped cooling element fewer ribs are provided in order to allow for the gripping of a clamp 21. The clamp preferably encompasses the power transistor 19 and the cooling element 20 from the outside and in this way fastens the cooling elements 20 to the control unit and the transistor 19.

Direct contact to the power transistors 19 via a bore in the printed circuit board 10 is particularly advantageous for power transistors of the SMD version. Transistors of the SMD version, due to their type, do not exhibit cooling lugs on which cooling elements can be fastened. In order to be able to connect the cooling elements to the underside of the power transistor 19, an opening, preferably a bore, is provided in the printed circuit board, through which part of the cooling element protrudes. Such a bore has a diameter in the range from about 5 mm to about 7.5 mm. The cooling elements 20 are formed on the side facing the printed circuit board 10 with a peg-shaped projection 20a. This peg 20a protrudes into the opening provided in the printed circuit board underneath the transistor 19. The diameter of the peg 20a is preferably somewhat smaller than the inside diameter of the bore and is preferably in the range from some 4 mm to about 7 mm.

Figure 7B:
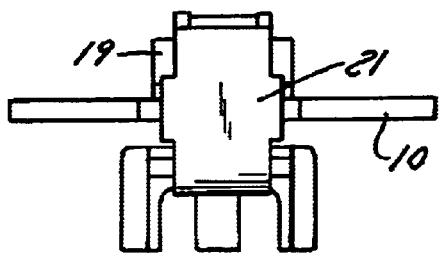
FIGS. 7a, 7b and 7c show various detailed views of the structure of the control unit according to FIG. 6.
Figure 7C:
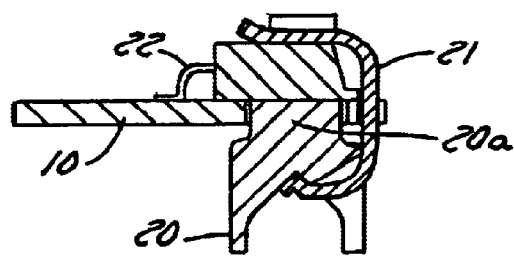
Figure 7A:
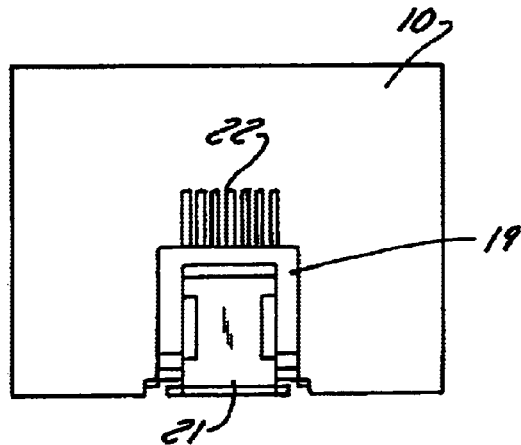

This structure is shown in detail in FIGS. 7a, 7b and 7c. FIG. 7a represents a top view of the printed circuit board 10 with the power transistor 19. The power transistor 19 is arranged on the rim of the printed circuit board 10 so that the clamp 21 for fastening the cooling element 20 is easy to mount. The printed circuit board 10 exhibits in the region of the mounted clamp 21 preferably a slight indentation for the strap of the clamp 21. The depth of this indentation preferably corresponds approximately to the thickness of the clamp 21. The transistor 19 is preferably arranged such that its connection contacts 22 do not point in the direction of the clamp 21.

In FIG. 7b a side view is shown. FIG. 7c shows a sectional view along the cutting line A—A in FIG. 7b. FIG. 7c shows that the cooling element 20 and the spring 21 are geometrically coordinated with each other such that fastening adequate to the position is ensured with an optimum pressure point.

Figure 8:
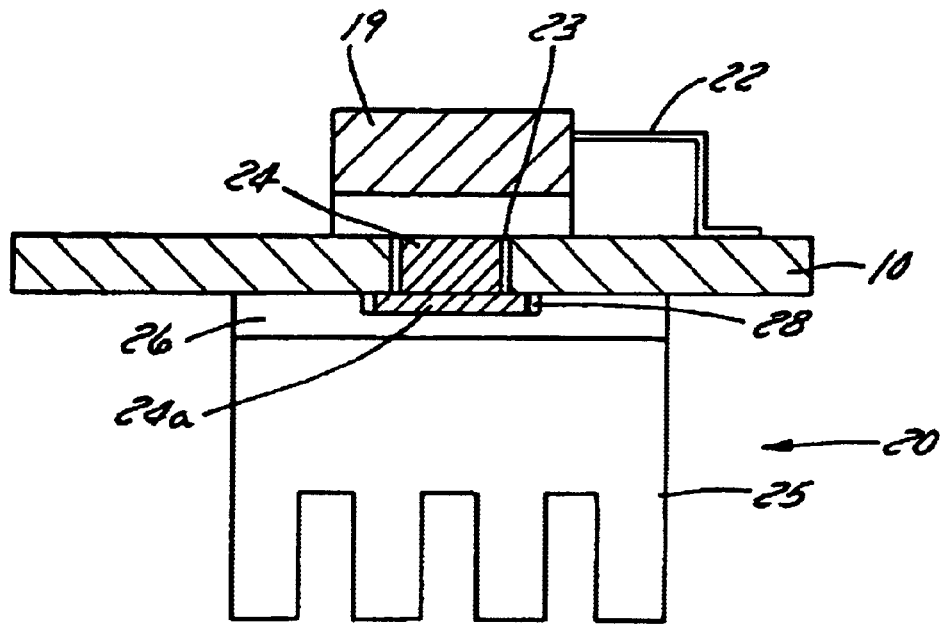
FIG. 8 shows a detailed view of the control unit with a power transistor and the cooling element allocated to it.
Figure 9:
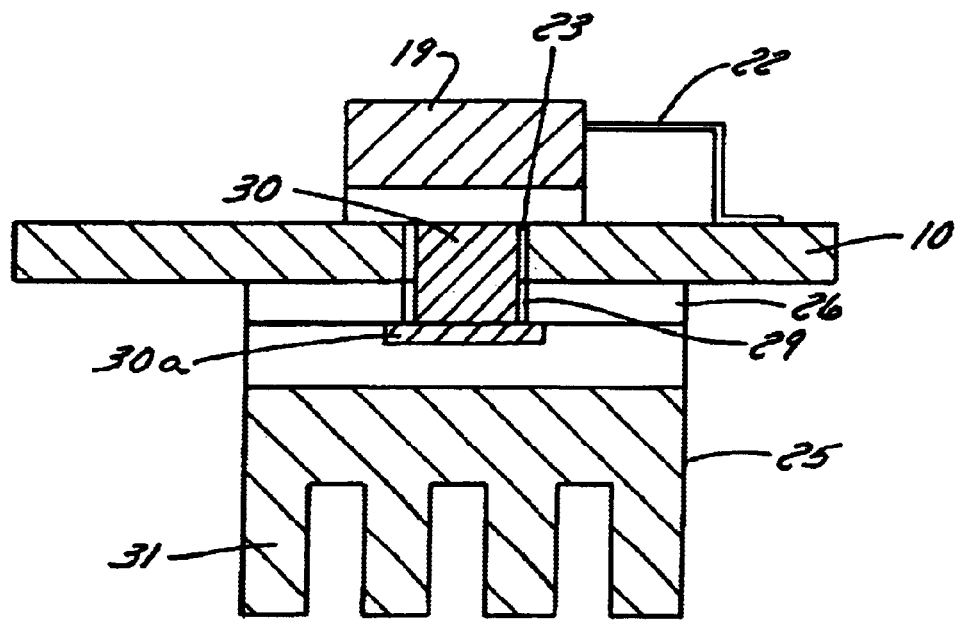
FIG. 9 shows an alternative embodiment of the structure of the cooling element in FIG. 8.

A further improved embodiment of the cooling element 20 illustrated in FIG. 7c is shown in FIG. 8 and FIG. 9 in two alternative embodiments. The cooling element 20 shown in FIG. 7c has a relatively large mass, which complicates the manufacturing process and clearly limits the choice of transistor types available due to the heat resistance of the transistors required for manufacture.

In FIG. 8 and FIG. 9 two alternative embodiments of a cooling element are shown which significantly reduce the considerable thermal mass (so problematical in the manufacturing process) of the cooling element 20 due to a two-part structure.

For this purpose, the cooling element 20 is divided into two components joined to each other: the heat-conducting element 24 and the cooling body 25. The heat-conducting element 24 is inserted into the bore 23 of the printed circuit board 10. During the manufacturing process the duration of the warm-up period is not delayed due to the small thermal mass of the heat-conducting element 24. Accordingly, in this case no special requirements need to be made on the heat resistance of the power transistor 19.

Connected to the heat-conducting element 24, and in a heat-conducting manner, is a cooling body 25 on the side of the printed circuit board 10 opposite the transistor. The cooling body 25 exhibits a large thermal mass with cooling ribs in order to be able to effectively remove the dissipation heat generated by the power transistor 19.

According to a special embodiment of the invention, the heat-conducting element 24 has a cylindrical shape. Advantageously, the heat-conducting element 24 consists of two sections: a first section, insertable into the bore 23 in the printed circuit board 10 and in contact with the transistor 19, has a smaller cross-section area whereas a second section 24a has a larger cross-section area at the end of the heat-conducting element protruding from the board.

The second section 24a of the heat-conducting element makes contact with the cooling body 25 in a heat-conducting manner. The cooling body 25 exhibits an essentially flat section 26 which can be connected to the heat-conducting element 24 and eventually to the printed circuit board 10, and cooling ribs protruding vertically outwards from the section 26. The section 26 of the cooling body has a recess 28 on the side facing the heat-conducting element 24. This recess serves to accommodate section 24a of the heat-conducting element protruding from the printed circuit board 10.

The heat-conducting element 24 and the cooling body 25 are preferably glued. Gluing of the two parts 24 and 25 of the cooling element is preferably accomplished with epoxy resin glue, silicon glue or acrylic glue. Epoxy resin glue allows for a particularly tight joining of the two components. The silicon glue can compensate for differing expansion coefficients of the materials glued together, particularly if the cooling body 25 is additionally connected to the printed circuit board 10 in order to increase the resistance of the cooling body to mechanical stress. These glues have in particular the advantage that with the glued components no plane-parallel surfaces are required since unevenness can be compensated for by the glue itself.

Preferably the glue used simultaneously effects an electric insulation of the two components 24, 25 of the cooling element 20 glued together. Whereas the potential of the output terminal of the transistor 19, generally positive potential, is present on the heat-conducting element 24, the cooling body 25 is potential-free. The cooling ribs of the cooling body 25 are arranged for heat dissipation such that they are freely accessible from the outside. By means of an electrically insulating (but highly heat-conductive) connection of the two components, any danger of a short circuit due to metal parts falling onto the heating device and contacting the cooling ribs is excluded. In this way, the operating safety of the heating device can be significantly increased.

FIG. 9 shows an alternative structure of the two-part cooling element 20. The heat-conducting element 30 is formed here such that, in addition to protruding through the printed circuit board 10, it also protrudes through section 26 of the cooling body 25, which is in contact with the printed circuit board 10. On the portion of the heat-conducting element 30 protruding from section 26 at least one lateral projection is provided, preferably a bulb 30a laterally fitting around, for mechanical fastening of the cooling body with its section 26 to the printed circuit board 10. With such an embodiment, gluing together of the two components is not necessary.

In order to achieve electric insulation of the cooling body 25, the latter is provided on its surface with an electrically insulating coating 31. Preferably, this coating is only applied to those parts of the surface which are freely accessible from the outside, such as those lying in the window openings 7. Such a coating 31 can be used in addition to an electric insulation by means of a glue according to the embodiment shown in FIG. 8 for achieving better fail-safety.

Figure 10:
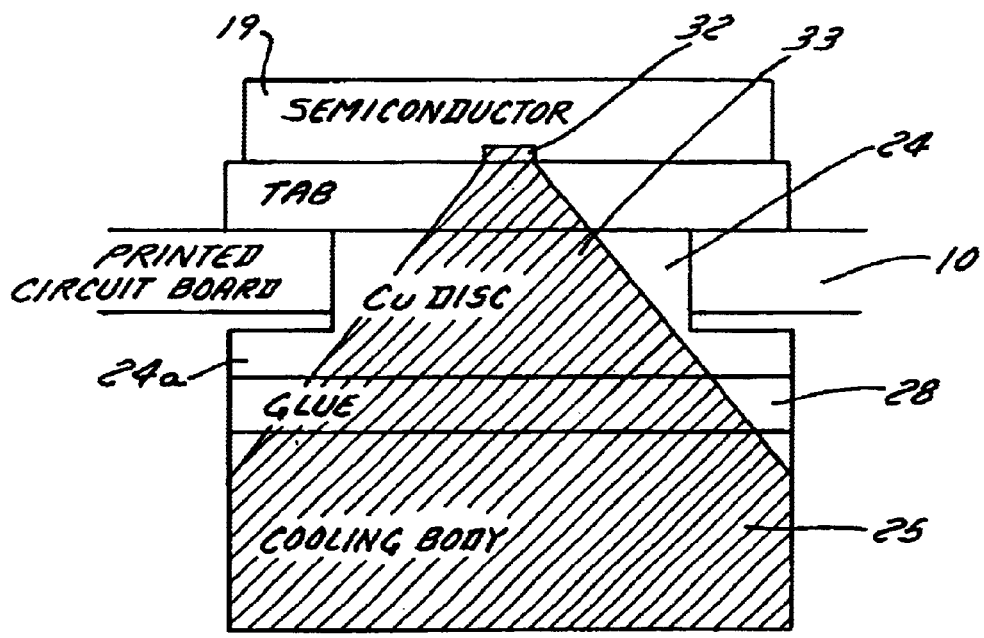
FIG. 10 shows the heat dissipation cone starting from the semiconductor element of the power transistor.

Additional marginal conditions for an embodiment of the heat-conducting element 24 are described below with reference to FIG. 10. The dissipation heat to be removed from the transistor 19 is generated in the semiconductor element 32 of the transistor. Starting from the semiconductor element 32 the dissipation heat can be removed via the "heat conducting cone" 33 only in principle indicated in FIG. 10. The actual shape of the heat-conducting cone 33 depends on the concrete conditions of each case. If the heat from the semiconductor element 32 can be led off to the cooling body 25 only via such a heat-conducting cone 33, then an ever so large cross-section area of the heat-conducting element 24 cannot result in any improvement in heat dissipation. The heat-conducting element 24 is therefore preferably formed such that it is analogous to the shape of the heat-conducting cone 33. For this purpose, the heat-conducting element 24 is advantageously formed with correspondingly larger cross-section areas at an increasing distance from the transistor. For this, the heat-conducting element is formed in a simple-to-produce variant with a smaller cross-section within the printed circuit board and with a larger cross-section in the section 24a protruding from the printed circuit board 10. Preferably the heat-conducting element 24 is cylindrically formed.

Figure 11:
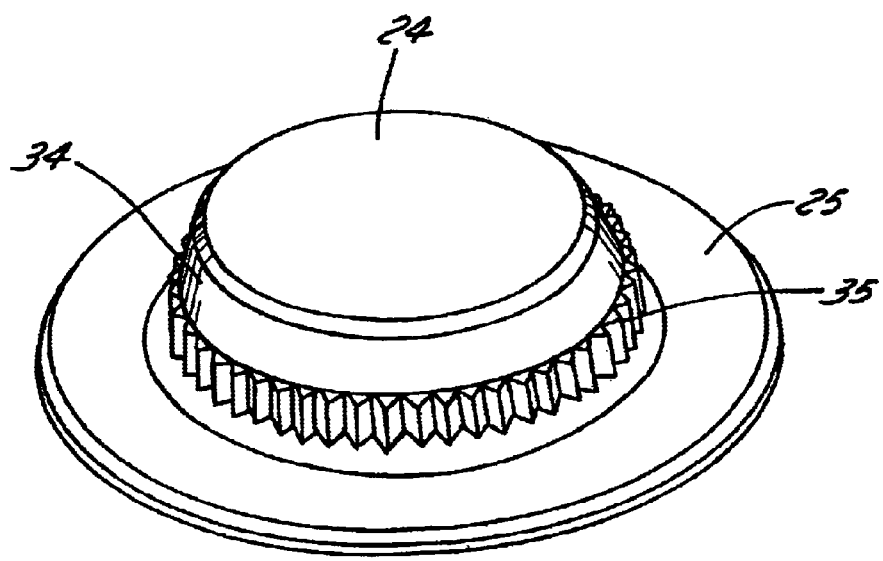
FIG. 11 shows an advantageous embodiment of the structure of a heat-conducting element.

An additional exemplary embodiment of the heat-conducting disk 24 is shown in FIG. 11. The heat-conducting disk 24 consists of two essentially cylindrically formed sections: a first section insertable into the printed circuit board 10 and exhibiting a cylindrical shape with a smaller diameter, and a second section 25 protruding from the printed circuit board 10 and having a cylindrical shape with a markedly larger diameter. The first section insertable into the printed circuit board 10 preferably exhibits a slightly conical shape. In this way insertion of the heat-conducting disk is facilitated and the shape of the heat-conducting disk is better adapted to the heat-conducting cone 33 (cf FIG. 10).

In the embodiment shown in FIG. 11 there are radial projections 35 additionally arranged on the circumference of the section insertable into the printed circuit board 10. These projections 35 each have a wedge shape with a point protruding outwards. The projections 35 are formed such that their points are formed slightly larger than the inside diameter of the opening 23 in the printed circuit board 10. In this way, the heat-conducting element 24 is mechanically anchored in the printed circuit board after being inserted therein. Insertion of the heat-conducting element is facilitated in that the projections 35 each have a vertical alignment. Where applicable, the projections 35 are slightly slanted in accordance with the conical shape of the first section in order to facilitate insertion of the heat-conducting disk 24 into the printed circuit board 10.

Figure 12:
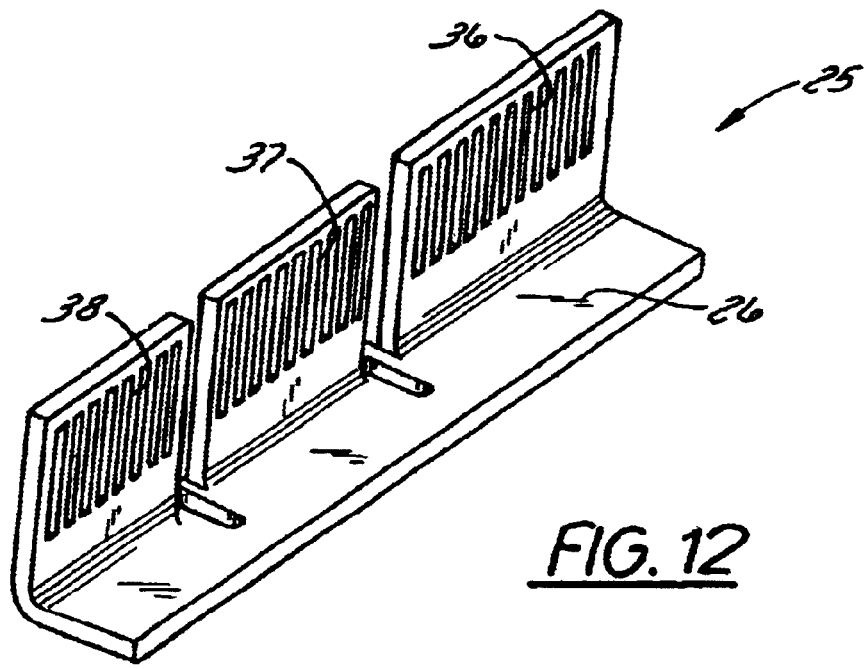
FIG. 12 and FIG. 13 show an advantageous embodiment of the cooling body.
Figure 13:
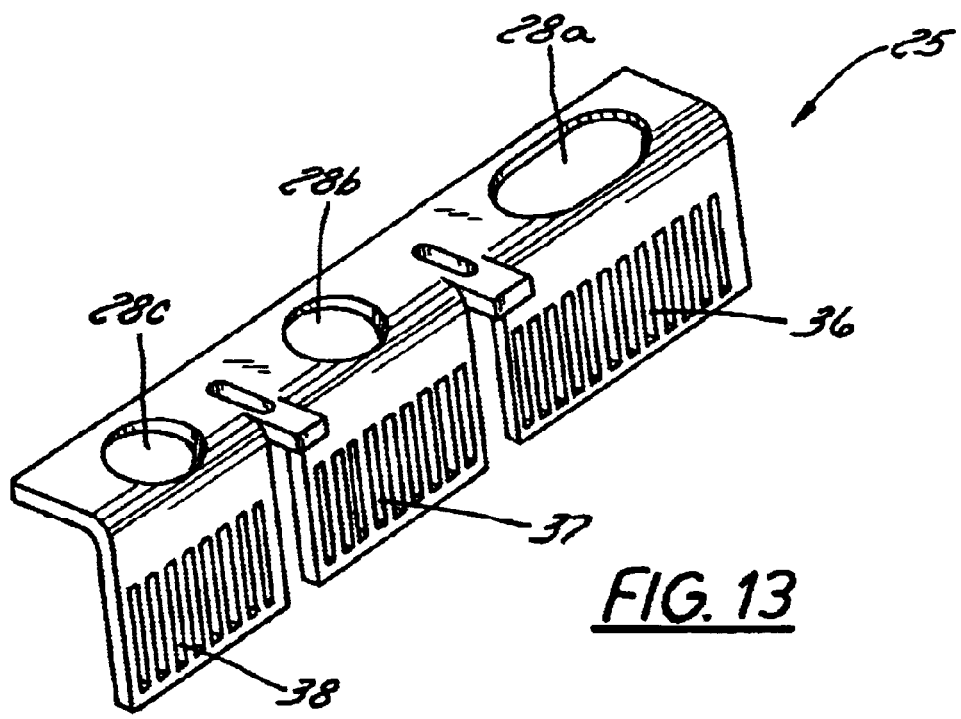

FIG. 12 and FIG. 13 show a special embodiment of the cooling body 25. The cooling body 25 preferably consists of an essentially two-part structure with a cooling rib section 36, 37, 38 aligned in the flat section 26 and aligned vertically to the same. The cooling body 25 is preferably formed rectangularly so that it can be manufactured simply and inexpensively as a punched and bent piece.

In FIG. 13 the recesses 28a, 28b, 28c can be recognised, which are provided for on the side of section 26 in contact with the printed circuit board 10. These recesses serve to accommodate section 24a of the heat-conducting element 24 protruding from the printed circuit board 10.

According to the particularly preferred embodiment shown in FIG. 12 and FIG. 13 the cooling body 25 is formed in a single piece for several power transistors 19 (and the corresponding heat-conducting elements 24). In this way manufacture of the cooling body 25 is further simplified. In addition, due to the larger thermal mass of the cooling body 25, the dissipation heat of the individual power transistors 19 can be better removed if the individual loss power of the transistors varies in magnitude.

In summary, the present invention relates to an electric heating device as supplemental heating for motor vehicles where the damper register and the control unit are integrated into one single structural unit. For controlling the heating elements of the damper register power transistors directly mounted on the printed circuit board are provided. For efficient removal of the dissipation heat from the power transistors the latter are in direct contact on their underside with a cooling element via openings in the printed circuit board. In order to simplify manufacture, the cooling elements are formed in two pieces: the heat-conducting disk with a small thermal mass insertable into the opening of the printed circuit board, and the cooling body which can be connected to that heat-conducting element.

What is claimed is:

1. An electric heating device, usable as a supplemental heater for a motor vehicles, comprising:

a heater block including a plurality of heating elements, and a control unit for controlling the heating elements, wherein the control unit forms one structural unit with the heater block and has power transistors arranged on a printed circuit board and cooling elements allocated to these power transistors, wherein each cooling element is connected through an opening in the printed circuit board to the respective power transistor, wherein each cooling element is formed from a cooling body and a heat-conducting element insertable into the opening of the printed circuit board, and wherein each heat-conducting element of each cooling element is mechanically fixed in the opening.

2. The electric heating device according to claim 1, wherein each heat-conducting element is glued to the cooling body.

3. The electric heating device according to claim 2, wherein the glue used to glue each heat-conducting element and the associated cooling body produces an electric insulation between the heat-conducting element and the cooling body.

4. The electric heating device according to claim 1, wherein each heat-conducting element is made of copper.

5. The electric heating device according to claim 1, wherein each cooling body is made of aluminum.

6. The electric heating device according to claim 1, wherein the mass each heat-conducting element is very much smaller than that of the associated cooling body.

7. The electric heating device according to claim 1, wherein each opening in the printed circuit board and each heat-conducting element are at least essentially cylindrical.

8. The electric heating device according to claim 1, wherein each cooling body has at least an essentially flat section with an opening, each heat-conducting element has an end that protrudes through the opening in the flat section of the associated cooling body, and each heat-conducting element has at least one lateral projection on the end protruding through the associated cooling body for mechanically fastening the mating element to the cooling body.

9. The electric heating device according to claim 8, wherein the lateral projection on each heat-conducting element is a bulb laterally fitting around the protruding end of the heat-conducting element.

10. The electric heating device according to claim 1, wherein each cooling body is arranged in the heating device such that the air to be heated can be blown around the cooling body via a window openings in a housing of the heating device.

11. The electric heating device according to claim 1, wherein the surface of each of the cooling bodies is provided on the outside with an electrically insulating coating.

12. The electric heating device according to claim 11, wherein the surface of each of the cooling bodies is provided with an electrically insulating coating essentially only in the region opposite the window openings.

13. The electric heating device according to claim 2, wherein the glue is an epoxy resin glue, a silicon glue or an acrylic glue.

14. The electric heating device according to claim 1, wherein each heat-conducting element, as the distance from the associated power transistor increases, has a larger cross-section area.

15. The electric heating device according to claim 14, wherein each heat-conducting element is at least essentially cylindrical in shape.

16. Electric heating device according to claim 15, wherein the section of each heat-conducting element arranged in the opening of the printed circuit board has an at least essentially conical shape growing smaller in the direction of the end in contact with the associated power transistor.

17. The electric heating device according to claim 1, wherein each cooling body comprises an essentially rectangular cross-section with a first section arranged parallel to the printed circuit board and a second section arranged vertically thereto.

18. The electric heating device according to claim 17, wherein the first section of each cooling body has recesses on the side facing the printed circuit board for accommodating the end of the associated heat-conducting element protruding from the printed circuit board.

19. The electric heating device according to claim 17, wherein the cooling bodies of several adjacent cooling elements are formed in one piece.

20. The electric heating device according to claim 19, wherein the cooling bodies formed in one piece are connected to each other via the first section of each of the cooling bodies.

21. An electric heating device, usable as a supplemental heater for a motor vehicle, each comprising:

a heater block, and a control unit for controlling the heating elements, wherein the control unit forms one structural unit with the heater block and has power transistors arranged on a printed circuit board and cooling elements allocated to these power transistors, wherein each cooling element is connected through an opening in the printed circuit board to the respective power transistor, wherein each cooling element is formed from a cooling body and a heat-conducting element insertable into the opening of the printed circuit board, wherein each heat-conducting element, as the distance from the power transistor increases, has a larger cross-section area, wherein each heat-conducting element is at least essentially cylindrical, wherein the section of each heat-conducting element arranged in the opening of the printed circuit board has an at least essentially conical shape growing smaller in the direction of the end in contact with the power transistor, and wherein the section of each heat-conducting element that is arranged in the opening of the printed circuit board has radial projections for mechanical fastening the heat-conducting element in the opening of the printed circuit board.

22. An electric heating device comprising:

a heater block having a plurality of heating elements, and a control unit that forms a single structural unit with the heater block and that controls the heating elements, the control unit including a plurality of power transistors arranged on a printed circuit board and a plurality of cooling elements, each of which is allocated to a respective one of the power transistors, wherein each of the cooling elements is connected through an opening in the printed circuit board to the associated power transistor, and wherein each of the cooling elements is formed from a cooling body and a heat-conducting element inserted into the opening of the printed circuit board, and wherein the heat-conducting element is fixed in the opening in the printed circuit board.

23. The electric heating device according to claim 22, wherein the heat-conducting element of each of the cooling elements is glued to the associated cooling body.

24. The electric heating device according to claim 22, wherein the heat-conducting element of each of the cooling elements is made of one of copper and aluminum.

25. The electric heating device according to claim 22, wherein the cooling body of each of the cooling elements has an essentially flat section with an opening formed therein, wherein the heat-conducting element of each of the cooling elements protrudes through the opening in the flat section of the associated cooling body, and wherein the heat-conducting element of each of the cooling elements has at least one lateral projection on the end protruding through the associated cooling body and out of the latter for mechanically fastening of the associated cooling body to the printed circuit board.

26. The electric heating device according to claim 22, further comprising a housing that contains the heating device and that has window openings formed therein, and wherein the cooling bodies are arranged in the heating device such that air to be heated can be blown around them via the window openings in the housing.

27. The electric heating device according to claim 22, wherein an outside surface of each of the cooling bodies is provided with an electrically insulating coating.

28. The electric heating device according to claim 22, wherein a cross-sectional area of each of the cooling bodies increases as the distance from the associated power transistor increases.

29. The electric heating device according to claim 22, wherein each of the cooling bodies is at least essentially rectangular in cross-section with a first section extending at least generally parallel to the associated printed circuit board and a second section extending at least generally perpendicularly therefrom.

* * * * *